(12) United States Patent
Kaushik et al.

(10) Patent No.: US 12,212,318 B2
(45) Date of Patent: Jan. 28, 2025

(54) LOW-VOLTAGE DIFFERENTIAL SIGNALING (LVDS) TRANSMITTER CIRCUIT

(71) Applicant: STMicroelectronics International N.V., Geneva (CH)

(72) Inventors: Sandeep Kaushik, Greater Noida (IN); Paras Garg, Noida (IN)

(73) Assignee: STMicroelectronics International N.V., Geneva (CH)

( * ) Notice: Subject to any disclaimer, the term of this patent is extended or adjusted under 35 U.S.C. 154(b) by 11 days.

(21) Appl. No.: 18/098,421

(22) Filed: Jan. 18, 2023

(65) Prior Publication Data

US 2023/0275586 A1 Aug. 31, 2023

Related U.S. Application Data

(60) Provisional application No. 63/314,665, filed on Feb. 28, 2022.

(51) Int. Cl.
*H03K 19/0185* (2006.01)
*H03K 17/687* (2006.01)
*H03K 19/017* (2006.01)

(52) U.S. Cl.
CPC . *H03K 19/018514* (2013.01); *H03K 17/6871* (2013.01); *H03K 19/01707* (2013.01); *H03K 19/018585* (2013.01)

(58) Field of Classification Search
CPC ....... H03K 19/018514; H03K 17/6871; H03K 19/01707; H03K 19/018585;
(Continued)

(56) References Cited

U.S. PATENT DOCUMENTS 7,196,550 B1 3/2007 Reinschmidt
7,301,370 B1 11/2007 Hanna et al.
(Continued)

FOREIGN PATENT DOCUMENTS

EP 3154201 A1 4/2017

OTHER PUBLICATIONS

EPO Search Report and Written Opinion for counterpart application EP 23157338, report dated Jul. 14, 2023, 14 pgs.
(Continued)

*Primary Examiner* — Jung Kim
(74) *Attorney, Agent, or Firm* — Crowe & Dunlevy LLC

(57) ABSTRACT

A Low Voltage Differential Signaling (LVDS) transmitter includes driver circuit with a first transistor, a second transistor, a third transistor, a fourth transistor, a first resistor, and a second resistor. The first transistor is coupled between a first node and first output. The second transistor is coupled between the first node and a second output. The third transistor is coupled between the first output and a second node. The fourth transistor is coupled between the second output and the second node. The first resistor is coupled between the first output and a common mode node. The second resistor is coupled between the second output and the common mode node. A pre-driver circuit generates gate control signals controlling the first, second, third, and fourth transistors in response to a data signal. A controlled timing delay is applied to the timing of logic state transistors for the control signals.

8 Claims, 7 Drawing Sheets

(58) Field of Classification Search
CPC ....... H03K 19/018528; H03K 19/0185; H03K 19/018521; H03K 19/018507; H04L 25/028; H04L 25/0272; H04L 25/0284; H04L 25/0274; H04L 25/0276
See application file for complete search history.

(56) References Cited

U.S. PATENT DOCUMENTS

| | | |
|---|---|---|
| 9,362,917 B1 | 6/2016 | Lee |
| 9,425,781 B2 | 8/2016 | Nandy et al. |
| 9,625,938 B2 | 4/2017 | Thazhatheppattu et al. |
| 11,165,426 B1 | 11/2021 | Ashourloo et al. |
| 2003/0001619 A1* | 1/2003 | Uchiki ............... H03K 17/6872 326/83 |
| 2006/0066393 A1 | 3/2006 | Davis et al. |
| 2006/0097760 A1 | 5/2006 | Hori |
| 2009/0116564 A1 | 5/2009 | Chen et al. |
| 2012/0151232 A1 | 6/2012 | Fish, III |
| 2012/0217999 A1 | 8/2012 | Lee et al. |

OTHER PUBLICATIONS

Nidagundi, Jayashree : "Efficient Design of LVDS Transmitter in Compliance With IEEE Standard 1596.3-1996," ICTACT Journal on Microelectronics, Oct. 2020, vol. 06, Issue 03, pp. 987-990.

* cited by examiner

LVDS Transmitter

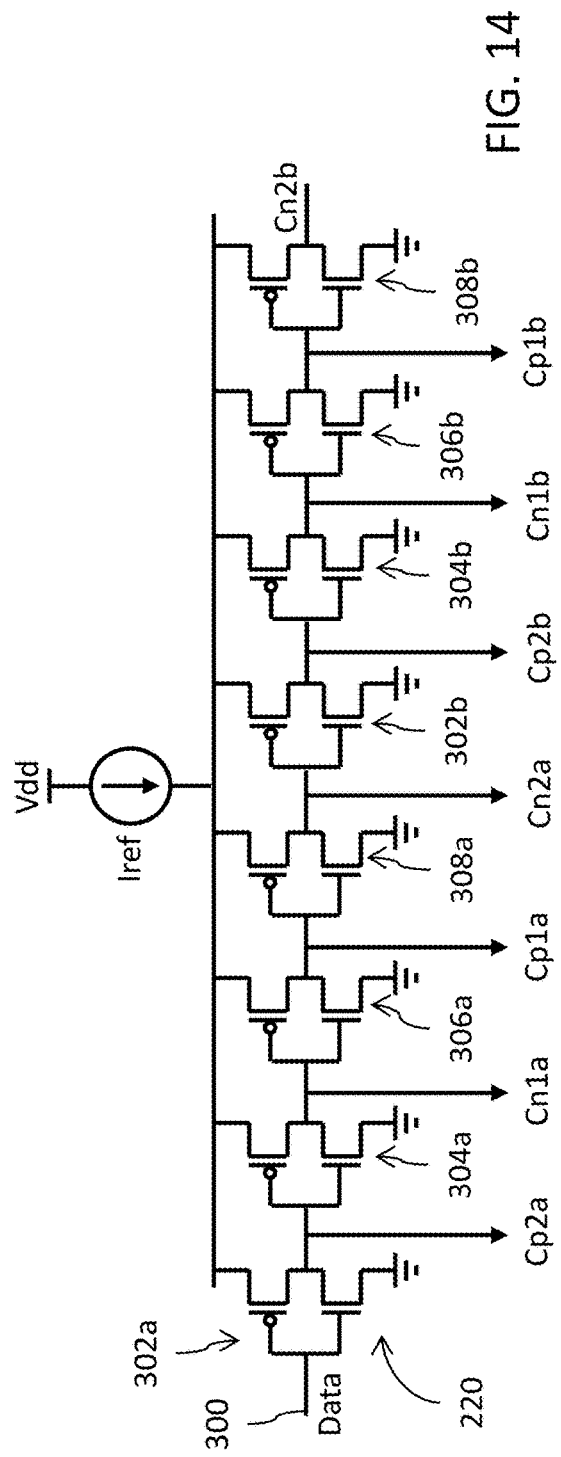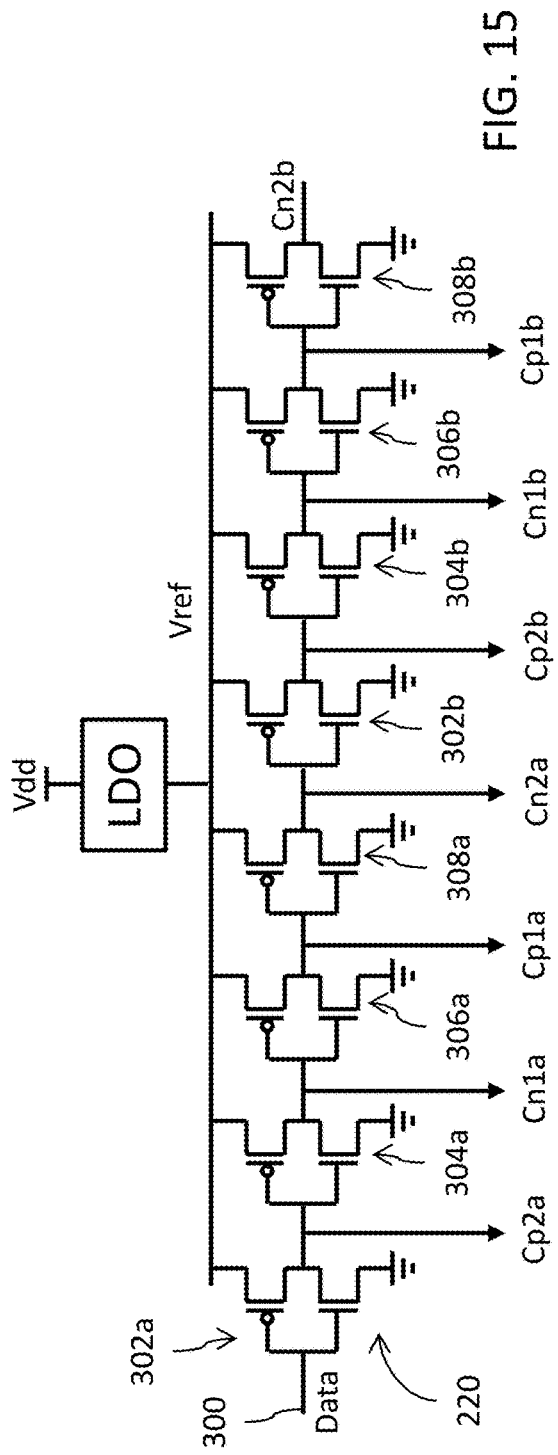

LOW-VOLTAGE DIFFERENTIAL SIGNALING (LVDS) TRANSMITTER CIRCUIT

CROSS REFERENCE TO RELATED APPLICATIONS

This application claims priority from United States Provisional Application for Patent No. 63/314,665, filed Feb. 28, 2022, the disclosure of which is incorporated herein by reference.

TECHNICAL FIELD

The present invention generally relates to a low-voltage differential signaling (LVDS) transmitter circuit and, in particular, to a circuit configuration that addresses concerns with transmit eye closure.

BACKGROUND

FIG. 1 shows a circuit diagram of a Low-Voltage Differential Signaling (LVDS) transmitter that includes a driver circuit 10 formed by a first current source I1, a second current source I2, a first p-channel Metal Oxide Semiconductor (pMOS) transistor P1, a second p-channel pMOS transistor P2, a first n-channel nMOS transistor N1, a second n-channel nMOS transistor N2, a first resistor R1, and a second resistor R2. The first current source I1 is coupled to a supply voltage node Vdd and configured to source a current to node 12. The source-drain paths of the first p-channel pMOS transistor P1 and the first n-channel nMOS transistor N1 are connected in series between node 12 and node 14. The series connection of the first p-channel pMOS transistor P1 and the first n-channel nMOS transistor N1 is made at node 16 which is coupled to a first (negative) transmitter output PadN. The source-drain paths of the second p-channel pMOS transistor P2 and the second n-channel nMOS transistor N2 are also connected in series between node 12 and node 14. The series connection of the second p-channel pMOS transistor P2 and the second n-channel nMOS transistor N2 is made at node 18 which is coupled to a second (positive) transmitter output PadP. The first and second transmitter outputs PadN and PadP provide the differential output signal of the driver circuit 10 for the LVDS transmitter. The second current source I2 is coupled to a reference voltage node Gnd and configured to sink a current from node 14. The first and second resistors R1 and R2 are connected in series between nodes 16 and 18. The series connection of the first and second resistors R1 and R2 is made at a common mode voltage node Vcm.

The LVDS transmitter further includes a pre-driver circuit 20 that receives an input data signal (Data) and generates a first gate control signal C1 that is applied to the gate terminals of the first pMOS transistor P1 and the first nMOS transistor N1 and a second gate control signal C2 that is applied to the gate terminals of the second pMOS transistor P2 and the second nMOS transistor N2. The first and second gate control signals C1, C2 are logic inversions of each other. The data signal Data may be a digital signal. In response to a first logic state of the input data signal Data, the control signals C1 and C2 (logic low and logic high, respectively) control the first pMOS transistor P1 and the second nMOS transistor N2 to be turned on and control the second pMOS P2 and the first nMOS transistor N1 to be turned off. The voltage at the node 16 (first transmitter output PadN) is charged toward Vdd and the voltage at the node 18 (second transmitter output PadP) is discharged toward Gnd. Conversely, in response to a second logic state of the input data signal Data, the control signals C1 and C2 (logic high and logic low, respectively) control the second pMOS P2 and the first nMOS transistor N1 to be turned on and control the first pMOS transistor P1 and the second nMOS transistor N2 to be turned off. The voltage at the node 18 (second transmitter output PadP) is charged toward Vdd and the voltage at the node 16 (first transmitter output PadN) is discharged toward Gnd.

| Data | Steps | P2 | N1 | P1 | N2 | Current to L | Current Change |
|---|---|---|---|---|---|---|---|
| Logic 0 | | OFF | OFF | ON | ON | −Ip, +In | 0 |
| Logic 0 | Step 1 | → ON | → ON | → OFF | → OFF | +Ip, −In | 2ΔI |
| → Logic 1 | | | | | | | |
| Logic 1 | | ON | ON | OFF | OFF | +Ip, −In | 0 |

| Data | Steps | P2 | N1 | P1 | N2 | Current to L | Current Change |
|---|---|---|---|---|---|---|---|
| Logic 1 | | ON | ON | OFF | OFF | +Ip, −In | 0 |
| Logic 1 | Step 1 | → OFF | → OFF | → ON | → ON | +Ip, −In | 2ΔI |
| → Logic 0 | | | | | | | |
| Logic 0 | | OFF | OFF | ON | ON | −Ip, +In | 0 |

The one step change for the driver circuit 10 as in Table 1A comprises the following for a logic change of the input data signal Data from logic 0 to logic 1: a simultaneous change of the transistors P2 and N1 from the OFF state to the ON state along with a simultaneous change of the transistors P1 and N2 from the ON state to the OFF state (in response to control signals C1 and C2 changing state). The reference in Tables 1A and 1B to "Current to L" shows the amount and polarity of current being delivered by the first and second transmitter outputs PadN and PadP through parasitic inductances, while the reference to "Current Change" refers to the change in current which occurs at each step of the transmitter 10 output change. So, in this case where there is only a single step for the change of the control signals C1 and C2, there is a significant and sudden corresponding change (i.e., 2ΔI) in output current for that step.

FIG. 2A illustrates an eye diagram for the LVDS transmitter of FIG. 1. During signal transition, the transmit eye closes due to noise arising from the sudden change in current. The driver circuit output voltage levels at the first and second transmitter outputs PadN and PadP are not consistently above the required threshold levels −Vod and +Vod, respectively. The main reason for this is that most of the transmitter current will pass through the parasitic inductance of the integrated circuit package and the dynamic output impedance of the transmitter circuit is high.

One solution to this problem is to reduce the resistance of the internal termination resistors R1 and R2. For example, the resistance of resistors R1 and R2 can be reduced from about 1.2 KΩ to about 50Ω. This will result in a corresponding increase in the transmitter eye opening as shown in FIG. 2B. Note here that the noise arising from the sudden change in current is above the required threshold levels −Vod and +Vod, and thus does not narrow the transmit eye. However, this solution presents a different problem in that driver current level is substantially increased (for example, about doubled) in order to achieve the same output voltage level as in FIG. 2A.

SUMMARY

A transmitter circuit comprises: a driver circuit including a first p-channel metal oxide semiconductor (pMOS) transistor and a first n-channel metal oxide semiconductor (nMOS) transistor connected in series between a first node and second node, wherein a series connection node of the first pMOS transistor and first nMOS transistor is connected to a first output node, wherein the first pMOS transistor is gate controlled by a first control signal, and wherein the first nMOS transistor is gate controlled by a second control signal; and a second pMOS transistor and a second nMOS transistor connected in series between said first node and second node, wherein a series connection node of the second pMOS transistor and second nMOS transistor is connected to a second output node, wherein the second pMOS transistor is gate controlled by a third control signal, and wherein the second nMOS transistor is gate controlled by a fourth control signal.

In an embodiment, a pre-driver circuit is configured to receive a data signal and generate logic state transitions in the first, second, third and fourth control signals in response to a given logic state transition of the data signal, wherein said pre-driver circuit causes the logic state transitions in the first, second, third and fourth control signals to occur over a plurality of steps for said given logic state transition of the data signal in the following order: step 1—transition the logic state of the third control signal; step 2—simultaneously transition the logic states of the first and second control signals; and step 3—transition the logic state of the fourth control signal.

In another embodiment, a pre-driver circuit is configured to receive a data signal and generate logic state transitions in the first, second, third and fourth control signals in response to a given logic state transition of the data signal, wherein said pre-driver circuit causes the logic state transitions in the first, second, third and fourth control signals to occur over a plurality of steps for said given logic state transition of the data signal in the following order: step 1— transition the logic state of the third control signal; step 2—transition the logic state of the first control signal; step 3—transition the logic state of the second control signal; and step 4—transition the logic state of the fourth control signal.

A transmitter circuit comprises a multi-stage driver circuit including: a first driver circuit and a second driver circuit connected in parallel with the first driver circuit. Each of the first and second driver circuits comprises: a first p-channel metal oxide semiconductor (pMOS) transistor and a first n-channel metal oxide semiconductor (nMOS) transistor connected in series between a first node and second node, wherein a series connection node of the first pMOS transistor and first nMOS transistor is connected to a first output node, wherein the first pMOS transistor is gate controlled by a first control signal, and wherein the first nMOS transistor is gate controlled by a second control signal; and a second pMOS transistor and a second nMOS transistor connected in series between said first node and second node, wherein a series connection node of the second pMOS transistor and second nMOS transistor is connected to a second output node, wherein the second pMOS transistor is gate controlled by a third control signal, and wherein the second nMOS transistor is gate controlled by a fourth control signal.

In an embodiment, a pre-driver circuit is configured to receive a data signal and generate logic state transitions in the first, second, third and fourth control signals in response to a given logic state transition of the data signal, wherein said pre-driver circuit causes the logic state transitions in the first, second, third and fourth control signals for the first driver circuit to occur before the logic state transitions in the first, second, third and fourth control signals for the second driver circuit for said given logic state transition of the data signal.

BRIEF DESCRIPTION OF THE DRAWINGS

For a better understanding of the embodiments, reference will now be made by way of example only to the accompanying figures in which:

FIGS. 10-15 show circuit diagrams for example of pre-driver circuits for use with the LVDS transmitters of FIGS. 3 and 7.

DETAILED DESCRIPTION

Figure 3:
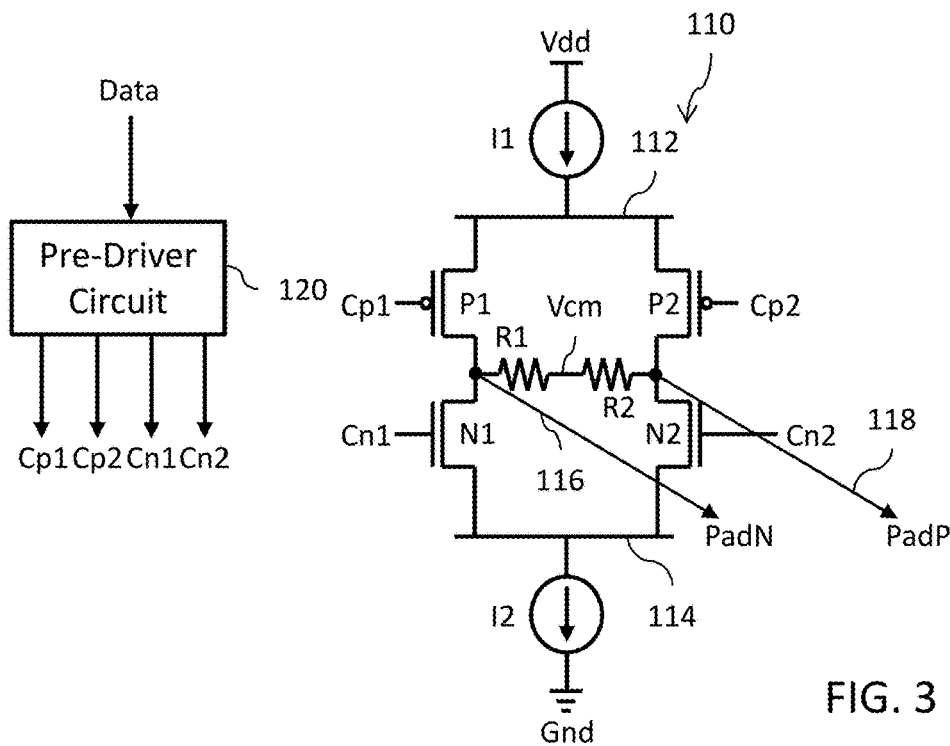
FIG. 3 is a circuit diagram of a LVDS transmitter.

Reference is now made to FIG. 3 which shows a circuit diagram of a Low-Voltage Differential Signaling (LVDS) transmitter that includes a driver circuit 110 formed by a first current source I1, a second current source I2, a first p-channel Metal Oxide Semiconductor (pMOS) transistor P1, a second p-channel pMOS transistor P2, a first n-channel nMOS transistor N1, a second n-channel nMOS transistor N2, a first resistor R1, and a second resistor R2. The first current source I1 is coupled to a supply voltage node Vdd and configured to source a current to node 112. The source-drain paths of the first p-channel pMOS transistor P1 and the first n-channel nMOS transistor N1 are connected in series between node 112 and node 114. The series connection of the first p-channel pMOS transistor P1 and the first n-channel nMOS transistor N1 is made at node 116 which is coupled to a first (negative) transmitter output PadN. The source-drain paths of the second p-channel pMOS transistor P2 and the second n-channel nMOS transistor N2 are also connected in series between node 112 and node 114. The series connection of the second p-channel pMOS transistor P2 and the second n-channel nMOS transistor N2 is made at node 118 which is coupled to a second (positive) transmitter output PadP. The first and second transmitter outputs PadN and PadP provide the differential output signal of the driver circuit 110. The second current source I2 is coupled to a reference voltage node Gnd and configured to sink a current from node 114. The first and second resistors R1 and R2 are connected in series between nodes 116 and 118. The series connection of the first and second resistors R1 and R2 is made at a common mode voltage node Vcm.

The LVDS transmitter further includes a pre-driver circuit 120 that receives an input data signal (Data) and generates a first gate control signal Cp1 that is applied to the gate terminal of the first pMOS transistor P1, a second gate control signal Cp2 that is applied to the gate terminal of the second pMOS transistor P2, a third gate control signal Cn1 that is applied to the gate terminal of the first nMOS transistor N1, and a fourth gate control signal Cn2 that is applied to the gate terminal of the second nMOS transistor N2. The data signal Data may be a digital signal. The pre-driver circuit 120 implements a controlled delay of the logic state transitions for the separate control signals Cp1, Cp2, Cn1 and Cn2 in response to any change in logic state of the data signal Data.

| Data | Steps | P2 | N1 | P1 | N2 | Current to L | Current Change |
|---|---|---|---|---|---|---|---|
| Logic 0 | | OFF | OFF | ON | ON | −Ip, +In | 0 |
| Logic 0 → | Step 1 | → ON | OFF | ON | ON | −Ip/2, +In/2 | ΔI/2 |
| Logic 1 | Step 2 | ON | → ON | → OFF | ON | −In/2, +Ip/2 | ΔI |
| | Step 3 | ON | ON | OFF | → OFF | +Ip, −In | ΔI/2 |
| Logic 1 | | ON | ON | OFF | OFF | +Ip, −In | 0 |

The three step change for the driver circuit 110 as in Table 2A comprises the following for a logic change of the input data signal Data from logic 0 to logic 1: step 1—the second pMOS transistor P2 changes from the OFF state to the ON state in response the change in logic state of the control signal Cp2 (Cp2→logic low); step 2—the first nMOS transistor N1 changes from the OFF state to the ON state in response the change in logic state of the control signal Cn1 (Cn1→logic high) and the first pMOS transistor P1 changes from the ON state to the OFF state in response the change in logic state of the control signal Cp1 (Cp1→logic high); and step 3—the second nMOS transistor changes from the ON state to the OFF state in response the change in logic state of the control signal Cn2 (Cn2→logic low).

| Data | Steps | P2 | N1 | P1 | N2 | Current to L | Current Change |
|---|---|---|---|---|---|---|---|
| Logic 1 | | ON | ON | OFF | OFF | +Ip, −In | 0 |
| Logic 1 → | Step 1 | ON | ON | → ON | OFF | −In/2, +Ip/2 | ΔI/2 |
| Logic 0 | Step 2 | → OFF | ON | ON | → ON | −Ip/2, +In/2 | ΔI |
| | Step 3 | OFF | → OFF | ON | ON | −Ip, +In | ΔI/2 |
| Logic 0 | | OFF | OFF | ON | ON | −Ip, +In | 0 |

The three step change for the driver circuit 110 as in Table 2B comprises the following for a logic change of the input data signal Data from logic 1 to logic 0: step 1—the first pMOS transistor P1 changes from the OFF state to the ON state in response the change in logic state of the control signal Cp1 (Cp1→logic low); step 2—the second nMOS transistor N2 changes from the OFF state to the ON state in response the change in logic state of the control signal Cn2 (Cn2→logic high) and the second pMOS transistor P2 changes from the ON state to the OFF state in response the change in logic state of the control signal Cp2 (Cp2→logic high); and step 3—the first nMOS transistor changes from the ON state to the OFF state in response the change in logic state of the control signal Cn1 (Cn1→logic low).

Figure 4:
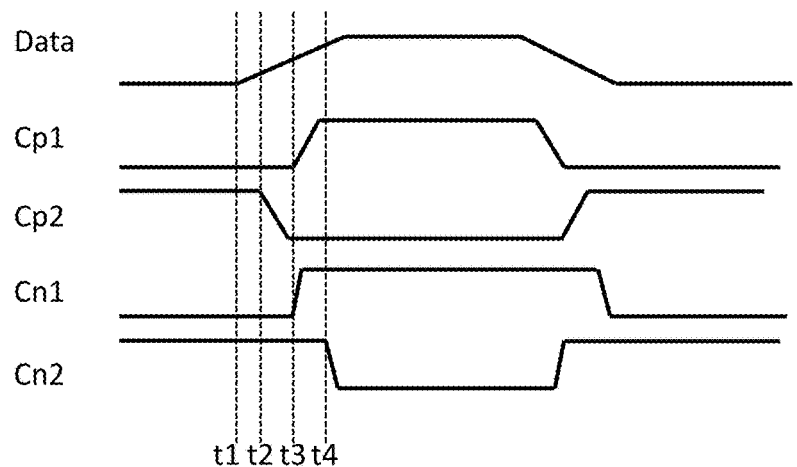
FIGS. 4 and 5 are timing diagrams for operation of the LVDS transmitter of FIG. 3.

FIG. 4 shows a timing diagram for operation of the driver circuit 110 in accordance with the three step change shown by Table 2A for a logic change of the input data signal Data from logic 0 to logic 1 and then from logic 1 to logic 0. For the sake of brevity, only details of the logic 0 to logic 1 change response will now be discussed. The input data signal Data changes from the first logic state towards the second logic state starting at time t1. Step 1 of the three step change occurs at time t2 with the logic state of the control signal Cp2 changing to logic low to turn on second pMOS transistor P2. Step 2 of the three step change occurs at time t3 with the logic state of the control signal Cn1 changing to logic high to turn on first nMOS transistor N2 and with the logic state of the control signal Cp1 changing to logic high to turn off first pMOS transistor P1. Step 3 of the three step change occurs at time t4 with the logic state of the control signal Cn2 changing to logic low to turn off second nMOS transistor N2.

| Data | Steps | P2 | N1 | P1 | N2 | Current to load | Current Change |
|---|---|---|---|---|---|---|---|
| Logic 0 | | OFF | OFF | ON | ON | −Ip, +In | 0 |
| Logic 0 → | Step 1 | → ON | OFF | ON | ON | −Ip/2, +In/2 | ΔI/2 |
| Logic 1 | Step 2 | ON | → ON | ON | ON | 0, 0 | ΔI/2 |
| | Step 3 | ON | ON | → OFF | ON | −In/2, +Ip/2 | ΔI/2 |
| | Step 4 | ON | ON | OFF | → OFF | +Ip, −In | ΔI/2 |
| Logic 1 | | ON | ON | OFF | OFF | +Ip, −In | 0 |

The four step change for the driver circuit 110 as in Table 3A comprises the following for a logic change of the input data signal Data from logic 0 to logic 1: step 1—the second pMOS transistor P2 changes from the OFF state to the ON state in response the change in logic state of the control signal Cp2 (Cp2→logic low); step 2—the first nMOS transistor N1 changes from the OFF state to the ON state in response the change in logic state of the control signal Cn1 (Cn1→logic high); step 3—the first pMOS transistor P1 changes from the ON state to the OFF state in response the change in logic state of the control signal Cp1 (Cp1→logic high); and step 4—the second nMOS transistor changes from the ON state to the OFF state in response the change in logic state of the control signal Cn2 (Cn2→logic low).

| Data | Steps | P2 | N1 | P1 | N2 | Current to load | Current Change |
|---|---|---|---|---|---|---|---|
| Logic 1 | | ON | ON | OFF | OFF | +Ip, −In | 0 |
| Logic 1 → | Step 1 | ON | ON | → ON | OFF | −In/2, +Ip/2 | ΔI/2 |
| Logic 0 | Step 2 | ON | ON | ON | → ON | 0, 0 | ΔI/2 |
| | Step 3 | → OFF | ON | ON | ON | −Ip/2, +In/2 | ΔI/2 |
| | Step 4 | OFF | → OFF | ON | ON | −Ip, +In | ΔI/2 |
| Logic 0 | | OFF | OFF | ON | ON | −Ip, +In | 0 |

The four step change for the driver circuit 110 as in Table 3B comprises the following for a logic change of the input data signal Data from logic 1 to logic 0: step 1—the first pMOS transistor P1 changes from the OFF state to the ON state in response the change in logic state of the control signal Cp1 (Cp1→logic low); step 2—the second nMOS transistor N2 changes from the OFF state to the ON state in response the change in logic state of the control signal Cn2 (Cn2→logic high); step 3—the second pMOS transistor P2 changes from the ON state to the OFF state in response the change in logic state of the control signal Cp2 (Cp2→logic high); and step 4—the first nMOS transistor changes from the ON state to the OFF state in response the change in logic state of the control signal Cn1 (Cn1→logic low).

Figure 5:
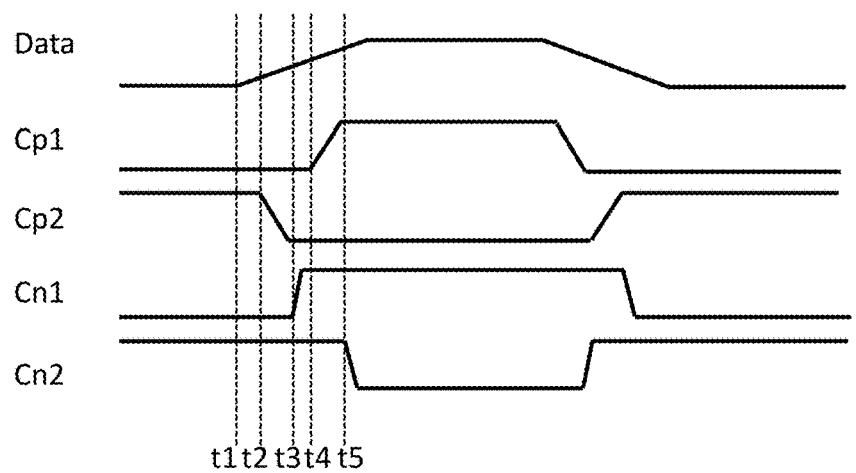

FIG. 5 shows a timing diagram for operation of the driver circuit 110 in accordance with the four step change shown by Table 3A for a logic change of the input data signal Data from logic 0 to logic 1 and then from logic 1 to logic 0. For the sake of brevity, only the details of the logic 0 to logic 1 change response will now be discussed. The input data signal Data changes from the first logic state towards the second logic state starting at time t1. Step 1 of the four step change occurs at time t2 with the logic state of the control signal Cp2 changing to logic low to turn on second pMOS transistor P2. Step 2 of the four step change occurs at time t3 with the logic state of the control signal Cn1 changing to logic high to turn on first nMOS transistor N2. Step 3 of the four step change occurs at time 4 with the logic state of the control signal Cp1 changing to logic high to turn off first pMOS transistor P1. Step 4 of the four step change occurs at time t5 with the logic state of the control signal Cn2 changing to logic low to turn off second nMOS transistor N2.

Figure 1:
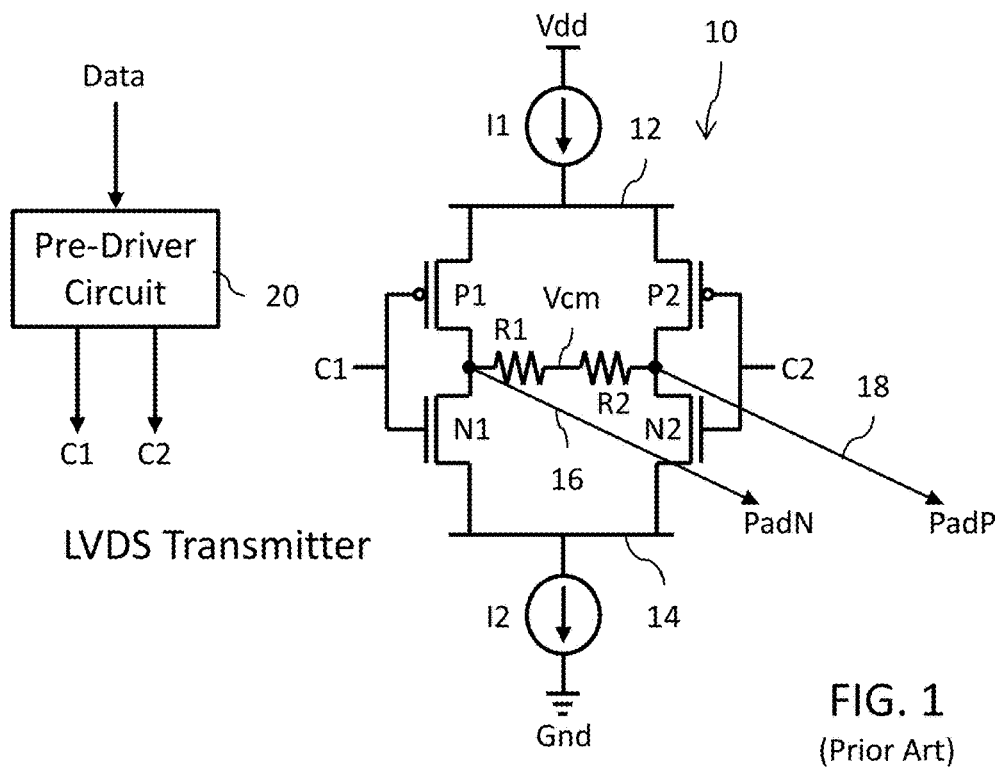
FIG. 1 is a circuit diagram of a Low-Voltage Differential Signaling (LVDS) transmitter.
Figure 2A:
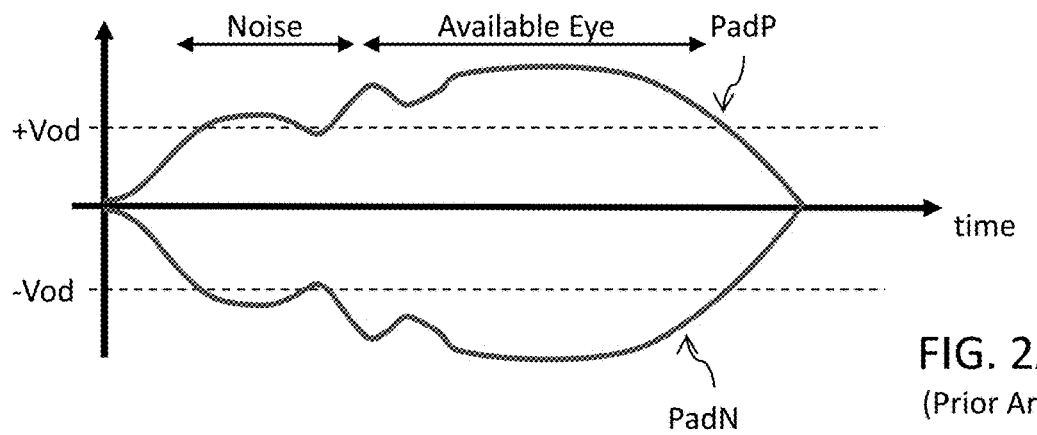
FIGS. 2A and 2B illustrate an eye diagram for the LVDS transmitter of FIG. 1.
Figure 2B:
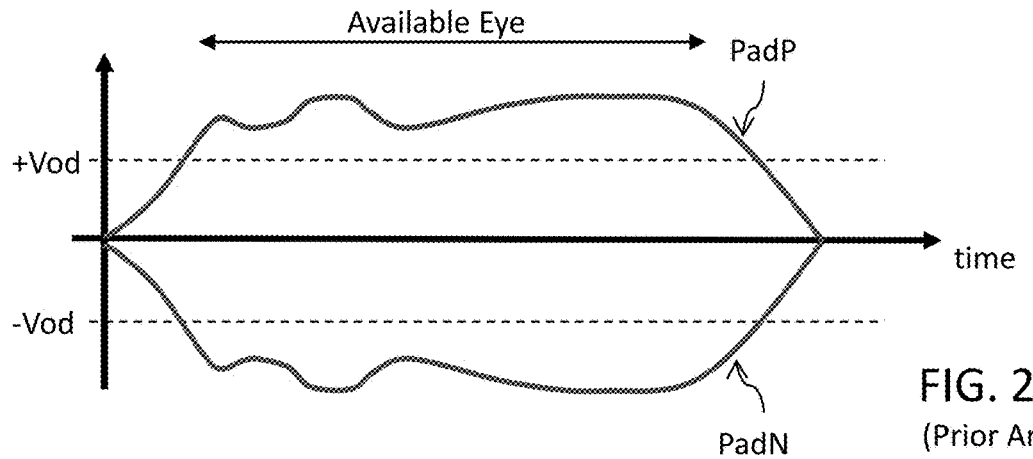
Figure 6:
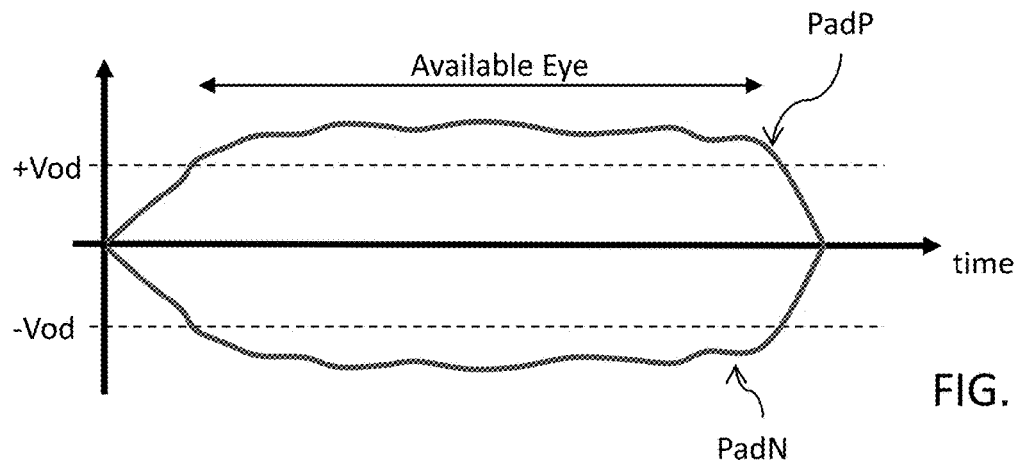
FIG. 6 illustrates an eye diagram for the LVDS transmitter of FIG. 3.

FIG. 6 illustrates an eye diagram for the LVDS transmitter of FIG. 3. It will be noted that the use of the multi-step change by the driver circuit 110 addresses the issue of noise and provides for a larger available eye in comparison to the one step operation as shown in FIG. 2A.

Figure 7:
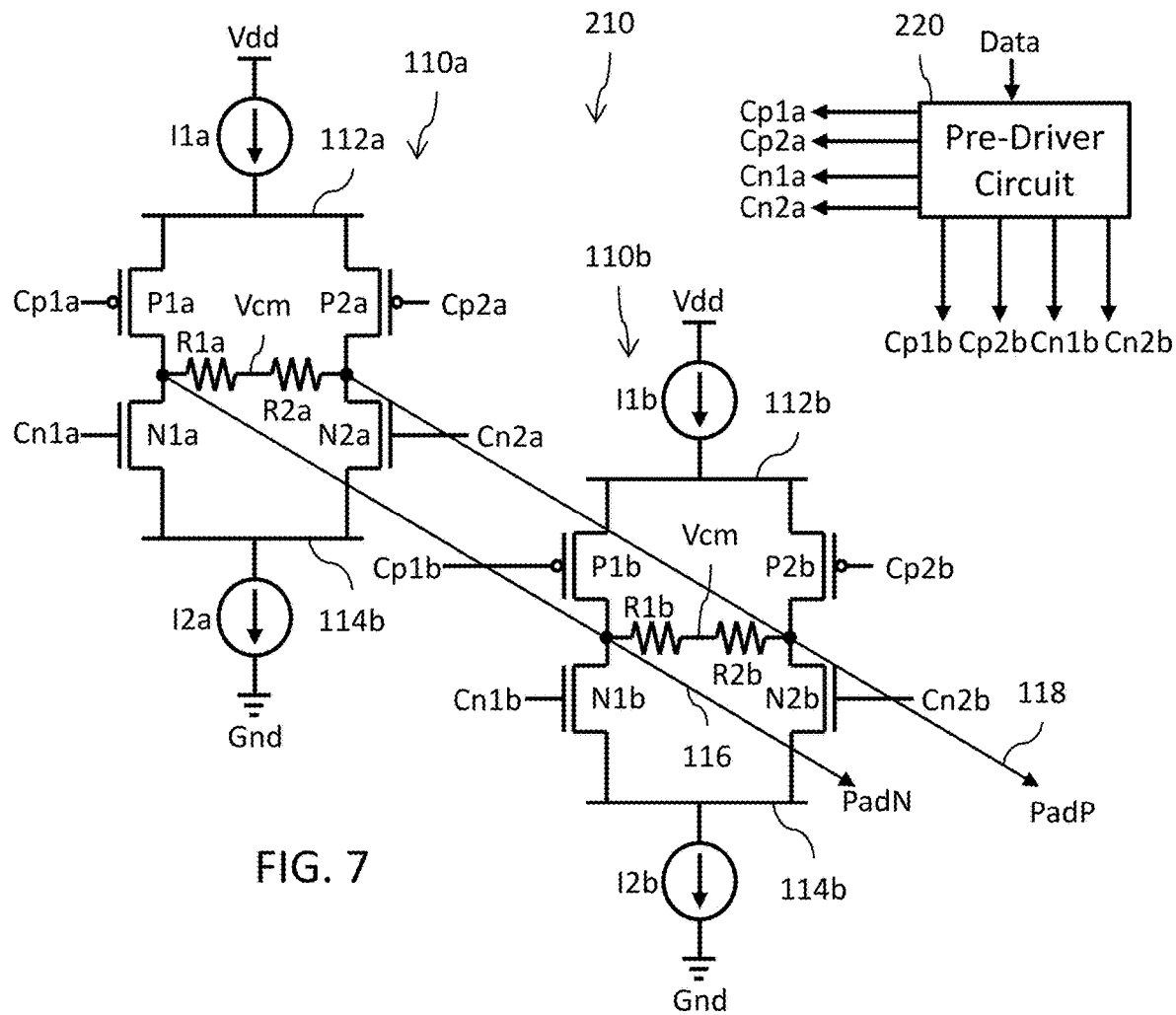
FIG. 7 is a circuit diagram of a LVDS transmitter.

Reference is now made to FIG. 7 which shows a circuit diagram of a Low-Voltage Differential Signaling (LVDS) transmitter that includes a multi-stage driver circuit 210 formed by a plurality of driver circuits 110, 110b connected in parallel. The LVDS transmitter further includes a pre-driver circuit 220 configured to drive operation of the driver circuits 110a, 110b. The implementation shown in FIG. 7 shows the use of two driver circuits 110, 110b, but it will be understood that this is by example only and the multi-stage driver circuit 210 may include N driver circuits 110 in parallel (where N is an integer greater than or equal to two). In FIG. 7, like reference numbers refer to same components with an alphabetical suffix ("a,", "b", etc.) distinguishing between the driver circuits 110 connected parallel.

The driver circuit 110a (110b) includes a first current source I1a (I1b), a second current source I2a (I2b), a first p-channel Metal Oxide Semiconductor (pMOS) transistor P1a (P1b), a second p-channel pMOS transistor P2a (P2b), a first n-channel nMOS transistor N1a (N1b), a second n-channel nMOS transistor N2a (N1b), a first resistor R1a (R1b), and a second resistor R2a (R2b). The first current source I1a (I1b) is coupled to a supply voltage node Vdd and configured to source a current to node 112a (112b). The source-drain paths of the first p-channel pMOS transistor P1a (P1b) and the first n-channel nMOS transistor N1a (N1b) are connected in series between node 112a (112b) and node 114a (114b). The series connection of the first p-channel pMOS transistor P1a (P1b) and the first n-channel nMOS transistor N1a (N1b) is made at node 116a (116b) which is coupled to a first (negative) transmitter output PadN. The source-drain paths of the second p-channel pMOS transistor P2a (P2b) and the second n-channel nMOS transistor N2a (N2b) are also connected in series between node 112a (112b) and node 114a (114b). The series connection of the second p-channel pMOS transistor P2a (P2b) and the second n-channel nMOS transistor N2a (N2b) is made at node 118a (118b) which is coupled to a second (positive) transmitter output PadP. The first and second transmitter outputs PadN and PadP provide the differential output signal of the transmitter circuit 210. The second current source I2a (I2b) is coupled to a reference voltage node Gnd and configured to sink a current from node 114a (114b). The first and second resistors R1a (R1b) and R2a (R2b) are connected in series between nodes 116a (116b) and 118a (118b). The series connection of the first and second resistors R1a (R1b) and R2a (R2b) is made at a common mode voltage node Vcm.

Figure 8:
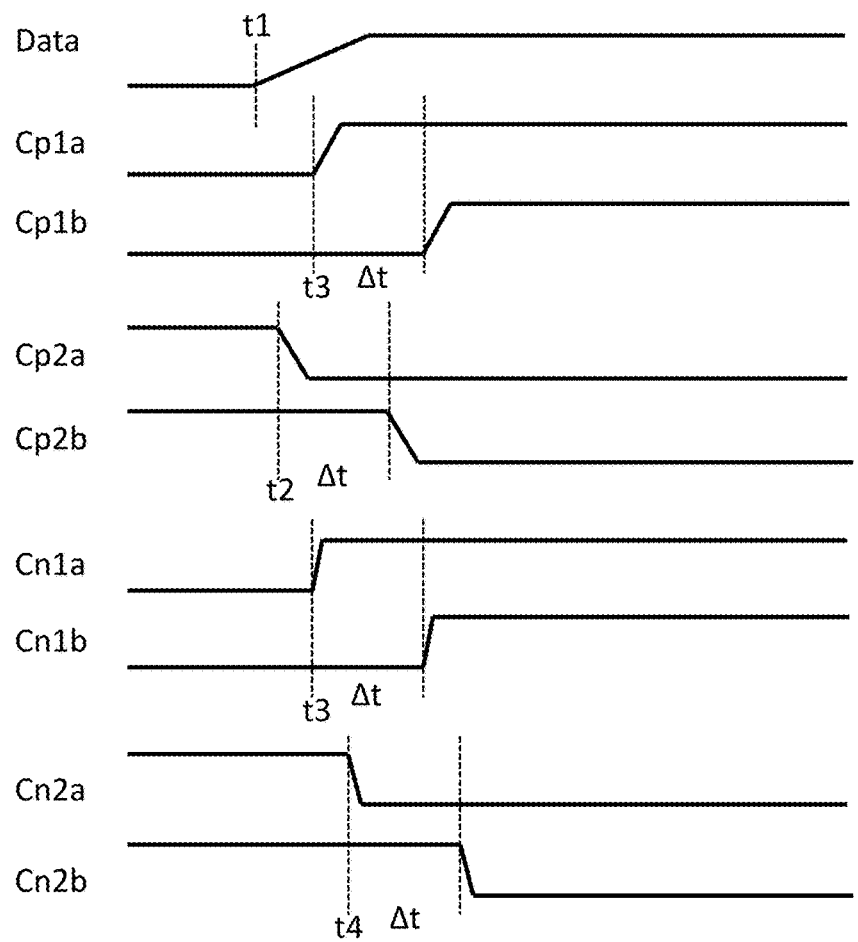
FIGS. 8 and 9 are timing diagrams for operation of the LVDS transmitter of FIG. 7.

The pre-driver circuit 220 receives an input data signal (Data) and generates a first gate control signal Cp1a (Cp1b) that is applied to the gate terminal of the first pMOS transistor P1a (P1b), a second gate control signal Cp2a (Cp2b) that is applied to the gate terminal of the second pMOS transistor P2a (P2b), a third gate control signal Cn1a (Cn1b) that is applied to the gate terminal of the first nMOS transistor N1a (N1b), and a fourth gate control signal Cn2a (Cn2b) that is applied to the gate terminal of the second nMOS transistor N2a (N2b). The data signal Data may be a digital signal. The pre-driver circuit 220 implements a controlled delay of the logic state transitions for the control signals Cp1a (Cp1b), Cp2a (Cp2b), Cn1a (Cn1b) and Cn2a (Cn2b) in response to any change in logic state of the data signal Data. The implementation of the controlled delay by the pre-driver circuit 220 for each of the driver circuits 110a, 110b is similar to that described above with respect to the pre-driver circuit 120 for the driver circuit 110. However, it will be noted that there is a delay of Δt that is implemented by the pre-driver circuit 220 between corresponding control signals. Take, for example, the control signals Cp2a and Cp2b. The change in logic state of the control signal Cp2a will occur at time t2 and the change in logic state of the control signal Cp2b will occur at time t2+Δt. Similarly: the change in logic state of the control signals Cn1a and Cp1a will occur at time t3 and the change in logic state of the control signals Cn1b and Cp1b will occur at time t3+Δt, and the change in logic state of the control signal Cn2a will occur at time t4 and the change in logic state of the control signal Cn2b will occur at time t4+Δt. This is shown in detail in FIG. 8 with respect to the three step change described in connection with Table 2A.

Figure 9:
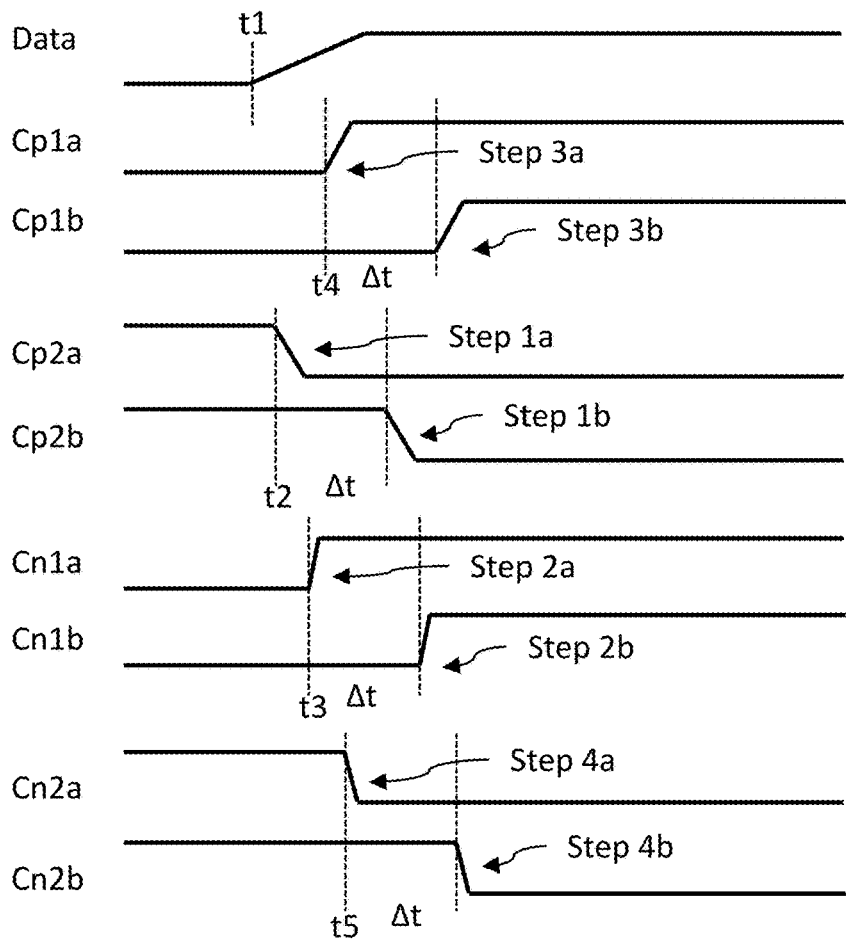

FIG. 9 is a timing diagram illustrating the implementation of the controlled delay by the pre-driver circuit 220 with respect to the four step change described in connection with Table 3A. Again, it will be noted that there is a delay of Δt that is implemented by the pre-driver circuit 220 between corresponding control signals. So: the change in logic state of the control signal Cp2a will occur at time t2 and the change in logic state of the control signal Cp2b will occur at time t2+Δt, the change in logic state of the control signal Cn1a will occur at time t3 and the change in logic state of the control signal Cn1b will occur at time t3+Δt, the change in logic state of the control signal Cp1a will occur at time t4 and the change in logic state of the control signal Cp1b will occur at time t4+Δt, and the change in logic state of the control signal Cn2a will occur at time t5 and the change in logic state of the control signal Cn2b will occur at time t5+Δt.

| Data | Steps | P2 | N1 | P1 | N2 | Current to load | Current Change |
|---|---|---|---|---|---|---|---|
| Logic 0 | | P2a OFF P2b OFF | N1a OFF N1b OFF | P1a ON P1b ON | N2a ON N26 ON | −Ip, +In | 0 |
| Logic 0 → Logic 1 | Step 1a | P2a → ON P2b OFF | N1a OFF N1b OFF | P1a ON P1b ON | N2a ON N26 ON | −Ip/2, +In/2 | ΔI/4 |

-continued

| Data | Steps | P2 | N1 | P1 | N2 | Current to load | Current Change |
|---|---|---|---|---|---|---|---|
| | Step 2a | P2a ON P2b OFF | N1a → ON N1b OFF | P1a ON P1b ON | N2a ON N26 ON | 0, 0 | ΔI/4 |
| | Step 3a | P2a ON P2b OFF | N1a ON N1b OFF | P1a → OFF P1b ON | N2a ON N26 ON | −In/2, +Ip/2 | ΔI/4 |
| | Step 4a | P2a ON P2b OFF | N1a ON N1b OFF | P1a OFF P1b ON | N2a → OFF N26 ON | +Ip, −In | ΔI/4 |
| | Step 1b | P2b → ON P2a ON | N1a ON N1b OFF | P1a OFF P1b ON | N2a OFF N26 ON | −Ip/2, +In/2 | ΔI/4 |
| | Step 2b | P2a ON P26 ON | N1b → ON N1a ON | P1a OFF P1b ON | N2a OFF N26 ON | 0,0 | ΔI/4 |
| | Step 3b | P2a ON P26 ON | N1a ON N1b ON | P1b > OFF P1a OFF | N2a OFF N26 ON | −In/2, +Ip/2 | ΔI/4 |
| | Step 4b | P2a ON P2b ON | N1a ON N1b ON | P1a OFF P1b OFF | N26 → OFF N2a OFF | +Ip, −In | ΔI/4 |
| Logic 1 | | P2a ON P26 ON | N1a ON N1b ON | P1a OFF P1b OFF | N2a OFF N2b OFF | +Ip, −In | 0 |

| Data | Steps | P2 | N1 | P1 | N2 | Current to load | Current Change |
|---|---|---|---|---|---|---|---|
| Logic 1 | | P2a ON P26 ON | N1a ON N1b ON | P1a OFF P1b OFF | N2a OFF N2b OFF | +Ip, −In | 0 |
| Logic 1 → Logic 0 | Step 1a | P2a ON P2b ON | N1a ON N1b ON | P1a → ON P1b OFF | N2a OFF N2b OFF | −In/2, +Ip/2 | ΔI/4 |
| | Step 2a | P2a ON P26 ON | N1a ON N1b ON | P1a ON P1b OFF | N2a > ON N2b OFF | 0, 0 | ΔI/4 |
| | Step 3a | P2a → OFF P26 ON | N1a ON N1b ON | P1a ON P1b OFF | N2a ON N2b OFF | −Ip/2, +In/2 | ΔI/4 |
| | Step 4a | P2a OFF P26 ON | N1a → OFF N1b ON | P1a ON P1b OFF | N2a ON N2b OFF | −Ip, +In | ΔI/4 |
| | Step 1b | P2a OFF P26 ON | N1a OFF N1b ON | P1a ON P1b → ON | N2a ON N2b OFF | −In/2, +Ip/2 | ΔI/4 |
| | Step 2b | P2a OFF P26 ON | N1a OFF N1b ON | P1a ON P1b ON | N2a ON N2b → ON | 0, 0 | ΔI/4 |
| | Step 3b | P2a OFF P2b → OFF | N1a OFF N1b ON | P1a ON P1b ON | N2a ON N26 ON | −Ip/2, +In/2 | ΔI/4 |
| | Step 4b | P2a OFF P2b 1 OFF | N1a OFF N1b → OFF | P1a ON P1b ON | N2a ON N26 ON | −Ip, +In | ΔI/4 |
| Logic 0 | | P2a OFF P2b OFF | N1a OFF N1b OFF | P1a ON P1b ON | N2a ON N26 ON | −Ip, +In | 0 |

It will be noted that each step of the four steps includes a sub-step corresponding to each included driver circuit 110a, 110b. The delay between implementation of sub-steps for each step is Δt as shown in FIG. 9. For example, there is a delay in the change of logic states for the signals Cp2a and Cp2b for sub-steps 1a and 1b of Δt.

With comparison to FIG. 3, the current sources and transistors in each driver circuit 110 in FIG. 7 are sized to be 1/N th the size of the corresponding current sources and transistors in driver circuit 110 of FIG. 3. In the specific example shown in FIG. 7 where N=2, the currents generated by the current sources I1a (I1b) and I2a (I2b) are one-half (i.e., ½) that of the currents generated by the sources I1 and I2 in FIG. 3. Likewise, the size (W/L)— where W is width and L is length—of the transistors P1a (P1b), P2a (P2b), N1a (N2b), N2a (N2b) is one-half (i.e., ½) of the size (W/L) of the transistors P1, P2, N1, N2 in FIG. 3. Thus, the overall drive capability of the multi-stage driver circuit 210 in FIG. 7 is the same as that of the driver circuit 110 in FIG. 3, but that drive capability is evenly split among the N included driver circuits 110a, 110b, etc.

Figure 10:
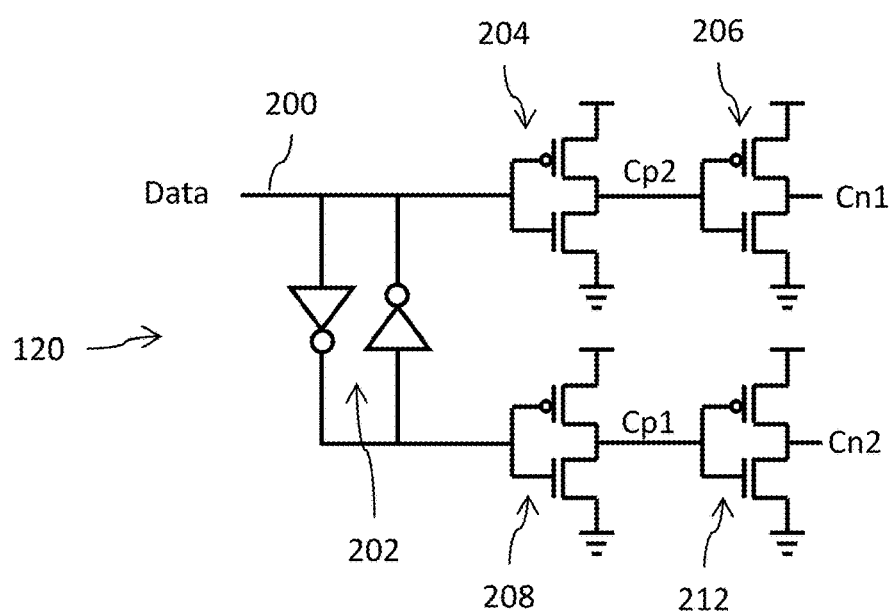

Reference is now made to FIG. 10 which shows a circuit diagram for the pre-driver circuit 120 (see, FIG. 3). The input data signal Data is received at an input node 200 and latched by a latch circuit 202 formed by a pair of cross-coupled logic inverters. A true side of the latch circuit 202 is coupled to the input of a first logic inverter circuit 204 whose output provides the control signal Cp2. A second logic inverter circuit 206 coupled in series with the first logic inverter circuit 204 has an output which provides the control signal Cn1. A false side of the latch circuit 202 is coupled to the input of a third logic inverter circuit 208 whose output provides the control signal Cp1. A fourth logic inverter circuit 212 coupled in series with the third logic inverter circuit 208 has an output which provides the control signal Cn2.

Figure 11:
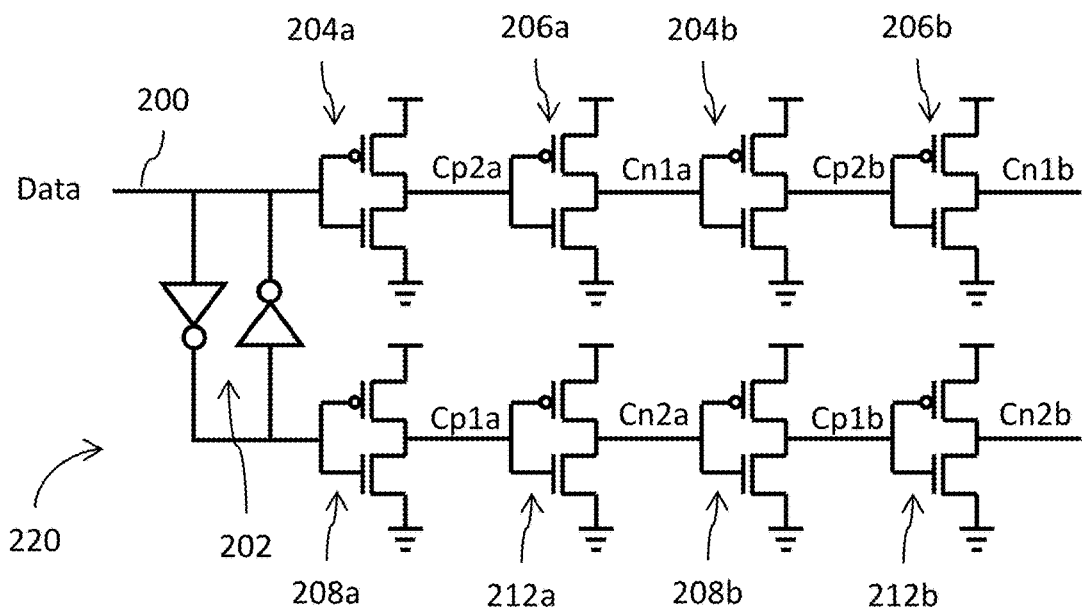

FIG. 11 shows a circuit diagram for the pre-driver circuit 220 (see, FIG. 7). Like references in FIGS. 10 and 11 refer to similar components. The pre-driver circuit 220 of FIG. 11 differs from the pre-driver circuit 110 of FIG. 10 in that it further includes an additional stage of first through fourth logic inverter circuits 204, 206, 208, 212. The first stage of first through fourth logic inverter circuits 204a, 206a, 208a, 212a produce the control signals Cp2a, Cn1a, Cp1a and Cn2a, respectively, while the second stage of first through fourth logic inverter circuits 204b, 206b, 208b, 212b produce the control signals Cp2b, Cn1b, Cp1b and Cn2b, respectively.

Figure 12:
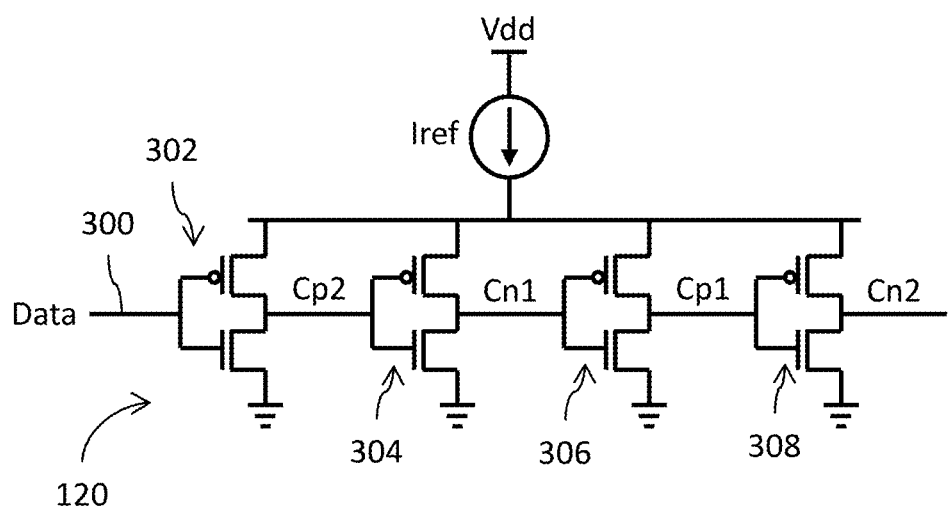

Reference is now made to FIG. 12 which shows a circuit diagram for the pre-driver circuit 120 (see, FIG. 3). The input data signal Data is received at an input node 300 and applied to the input of a first logic inverter circuit 302 whose output provides the control signal Cp2. A second logic inverter circuit 304 coupled in series with the first logic inverter circuit 302 has an output which provides the control signal Cn1. A third logic inverter circuit 306 coupled in series with the second logic inverter circuit 304 provides the control signal Cp1. A fourth logic inverter circuit 308 coupled in series with the third logic inverter circuit 306 has an output which provides the control signal Cn2. The source terminals of the p-channel MOS transistors of the inverter circuits 302, 304, 306 and 308 receive a reference current supplied by a current source circuit Iref. The magnitude of the sourced reference current controls the delay between respective logic transitions of the control signals Cp1, Cp2, Cn1, Cn2.

Figure 13:
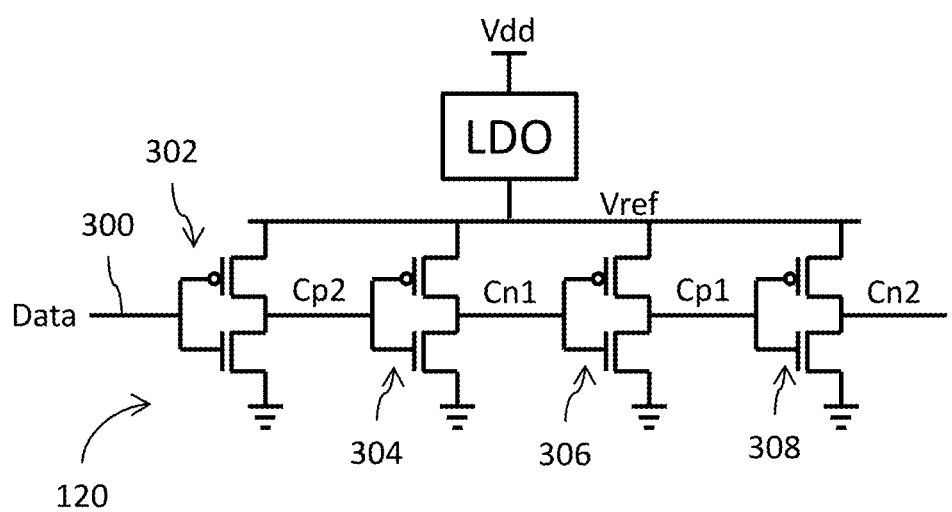

Reference is now made to FIG. 13 which shows a circuit diagram for the pre-driver circuit 120 (see, FIG. 3). The input data signal Data is received at an input node 300 and applied to the input of a first logic inverter circuit 302 whose output provides the control signal Cp2. A second logic inverter circuit 304 coupled in series with the first logic inverter circuit 302 has an output which provides the control signal Cn1. A third logic inverter circuit 306 coupled in series with the second logic inverter circuit 304 provides the control signal Cp1. A fourth logic inverter circuit 308 coupled in series with the third logic inverter circuit 306 has an output which provides the control signal Cn2. The source terminals of the p-channel MOS transistors of the inverter circuits 302, 304, 306 and 308 receive a reference voltage Vref supplied by a voltage regulator circuit (such as a low drop out (LDO) regulator). The magnitude of the sourced reference voltage controls the delay between respective logic transitions of the control signals Cp1, Cp2, Cn1, Cn2.

FIG. 14 shows a circuit diagram for the pre-driver circuit 220 (see, FIG. 7). Like references in FIGS. 12 and 14 refer to similar components. The pre-driver circuit 220 of FIG. 14 differs from the pre-driver driver circuit 110 of FIG. 12 in that it further includes an additional stage of first through fourth logic inverter circuits 302, 304, 306, 308. The first stage of first through fourth logic inverter circuits 302a, 304a, 306a, 308a produce the control signals Cp2a, Cn1a, Cp1a and Cn2a, respectively, while the second stage of first through fourth logic inverter circuits 302b, 304b, 306b, 308b produce the control signals Cp2b, Cn1b, Cp1b and Cn2b, respectively.

FIG. 15 shows a circuit diagram for the pre-driver circuit 220 (see, FIG. 7). Like references in FIGS. 13 and 15 refer to similar components. The pre-driver circuit 220 of FIG. 15 differs from the pre-driver circuit 110 of FIG. 13 in that it further includes an additional stage of first through fourth logic inverter circuits 302, 304, 306, 308. The first stage of first through fourth logic inverter circuits 302a, 304a, 306a, 308a produce the control signals Cp2a, Cn1a, Cp1a and Cn2a, respectively, while the second stage of first through fourth logic inverter circuits 302b, 304b, 306b, 308b produce the control signals Cp2b, Cn1b, Cp1b and Cn2b, respectively.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

The invention claimed is:

1. A transmitter circuit, comprising:
   a driver circuit including:
   a first p-channel metal oxide semiconductor (pMOS) transistor and a first n-channel metal oxide semiconductor (nMOS) transistor connected in series between a first node and second node, wherein a series connection node of the first pMOS transistor and first nMOS transistor is connected to a first output node, wherein the first pMOS transistor is gate controlled by a first control signal, and wherein the first nMOS transistor is gate controlled by a second control signal; and
   a second pMOS transistor and a second nMOS transistor connected in series between said first node and second node, wherein a series connection node of the second pMOS transistor and second nMOS transistor is connected to a second output node, wherein the second pMOS transistor is gate controlled by a third control signal, and wherein the second nMOS transistor is gate controlled by a fourth control signal; and
   a pre-driver circuit configured to receive a data signal and generate logic state transitions in the first, second, third and fourth control signals in response to a given logic state transition of the data signal, wherein said pre-driver circuit causes the logic state transitions in the first, second, third and fourth control signals to occur over a plurality of steps for said given logic state transition of the data signal in the following order:
   step 1-transition the logic state of the third control signal;
   step 2-simultaneously transition the logic states of the first and second control signals; and
   step 3-transition the logic state of the fourth control signal.

2. The transmitter circuit of claim 1, wherein the transition of the logic state of the third control signal turns on the second pMOS transistor, wherein the transition of the logic state of the first control signal turns off the first pMOS transistor, wherein the transition of the logic state of the second control signal turns on the first nMOS transistor, and wherein the transition of the logic state of the fourth control signal turns off the second nMOS transistor.

3. The transmitter circuit of claim 1, wherein said driver circuit further comprises:
   a first current source configured to source a current to the first node; and
   a second current source configured to sink a current from the second node.

4. The transmitter circuit of claim 1, wherein said driver circuit further comprises:
   a first resistor connected between the series connection node of the first pMOS transistor and first nMOS transistor and a common mode node; and
   a second resistor connected between the series connection node of the second pMOS transistor and second nMOS transistor and said common mode node.

5. The transmitter circuit of claim 1, wherein said pre-driver circuit comprises:
   a latch circuit configured to latch the data signal;
   a series connection of first and second inverter circuits coupled to a true side of the latch circuit, wherein said first inverter circuit generates the third control signal and said second inverter circuit generates said second control signal; and
   a series connection of third and fourth inverter circuits coupled to a false side of the latch circuit, wherein said third inverter circuit generates the first control signal and said fourth inverter circuit generates said fourth control signal.

6. The transmitter circuit of claim 1, wherein said pre-driver circuit comprises:
   an input configured to receive the data signal; and
   a series connection of first, second, third and fourth inverter circuits coupled to the input, wherein said first inverter circuit generates the third control signal, said second inverter circuit generates said second control signal, said third inverter circuit generates the first control signal and said fourth inverter circuit generates said fourth control signal.

7. The transmitter circuit of claim 6, wherein said pre-driver circuit further comprises current source configured to source a current to common source nodes of the first, second, third and fourth inverter circuits.

8. The transmitter circuit of claim 6, wherein said pre-driver circuit further comprises a regulator circuit configured to supply a reference voltage to common source nodes of the first, second, third and fourth inverter circuits.

* * * * *